United States Patent
Beck et al.

(10) Patent No.: US 10,020,411 B2
(45) Date of Patent: Jul. 10, 2018

(54) RETAINING SYSTEM FOR INSTALLING A PHOTOVOLTAIC MODULE

(75) Inventors: Bernhard Beck, Volkach (DE);
Michael Scholler, Kitzingen (DE);
Thomas Siedler, Rottendorf (DE)

(73) Assignee: Adensis GmbH, Dresden (DE)

(*) Notice: Subject to any disclaimer, the term of this patent is extended or adjusted under 35 U.S.C. 154(b) by 313 days.

(21) Appl. No.: 14/353,375

(22) PCT Filed: Aug. 16, 2012

(86) PCT No.: PCT/EP2012/003473
§ 371 (c)(1),
(2), (4) Date: Apr. 22, 2014

(87) PCT Pub. No.: WO2013/060400
PCT Pub. Date: May 2, 2013

(65) Prior Publication Data
US 2014/0261642 A1    Sep. 18, 2014

(30) Foreign Application Priority Data

Oct. 26, 2011  (DE) .......................... 10 2011 116 926
Apr. 20, 2012  (DE) .......................... 10 2012 008 001

(51) Int. Cl.
*H02S 20/00*  (2014.01)
*H01L 31/042*  (2014.01)
(Continued)

(52) U.S. Cl.
CPC .......... *H01L 31/0422* (2013.01); *F24J 2/523* (2013.01); *F24J 2/525* (2013.01); *F24J 2/5239* (2013.01);
(Continued)

(58) Field of Classification Search
CPC ....... H01L 31/042; H02S 20/00; H02S 20/10; H02S 20/30; Y02B 10/00; Y02E 10/47;
(Continued)

(56) References Cited

U.S. PATENT DOCUMENTS 5,143,556 A * 9/1992 Matlin .................. F24J 2/5232
136/244
2012/0056066 A1   3/2012 Habdank et al.

FOREIGN PATENT DOCUMENTS

DE        27 58 067 A1    7/1979
DE        2758067 A1 *    7/1979  ............... F24J 2/523
(Continued)

OTHER PUBLICATIONS

International Search Report (in German with English translation) for PCT/EP2012/003473, dated Mar. 22, 2013; ISA/EP.

*Primary Examiner* — Matthew T Martin
*Assistant Examiner* — Dujuan A Horton
(74) *Attorney, Agent, or Firm* — Muncy, Geissler, Olds & Lowe, P.C.

(57) ABSTRACT

The invention relates to a holding system (1) for mounting a photovoltaic module (6) to a base (8) by means of ground supports (2, 2*a*, 44, 44*a*) which comprise a bearing head (4, 4*a*, 50, 50*a*), a ground support body (22) and a bearing surface (28, 48) on the bottom side which counteracts a penetration of the ground supports into the base (8), wherein the ground supports (2, 2*a*, 46, 46*a*) comprise on their head side a bearing plate (14, 14', 14*a*, 14*a'*, 54, 54', 54*a*, 54*a'*) that is disposed at a slanted angle (α) in relation to the base (8), and wherein the ground supports (2, 2*a*, 46, 46*a*) are provided and prepared such that, in the mounted state, the bearing plates (14, 14', 14*a*, 14*a'*, 54, 54', 54*a*, 54*a'*) of a ground support pair (2, 2*a*, 46, 46*a*) are spaced apart from each other vertically in relation to the base (8) and from each
(Continued)

other horizontally in adjustment to the photovoltaic module (6) and that they are aligned with each other at least in essence.

19 Claims, 8 Drawing Sheets

(51) Int. Cl.
 *F24J 2/52* (2006.01)
 *H02S 20/23* (2014.01)
 *H02S 20/10* (2014.01)
(52) U.S. Cl.
 CPC .............. *H02S 20/10* (2014.12); *H02S 20/23* (2014.12); *Y02B 10/12* (2013.01); *Y02B 10/20* (2013.01); *Y02E 10/47* (2013.01)
(58) Field of Classification Search
 CPC .. F24J 2/523; F24J 2/525; F24J 2/5239; F24J 2/5252; F24J 2/5256; F24J 2/5258
 USPC ................ 136/244, 245, 251; 211/41.18
 See application file for complete search history.

(56) References Cited

FOREIGN PATENT DOCUMENTS

| | | |
|---|---|---|
| DE | 20 2008 003148 U1 | 6/2008 |
| DE | 10 2009 003151 A1 | 11/2010 |
| DE | 20 2011 050810 U1 | 9/2011 |
| JP | 2005-322821 | 11/2005 |

* cited by examiner

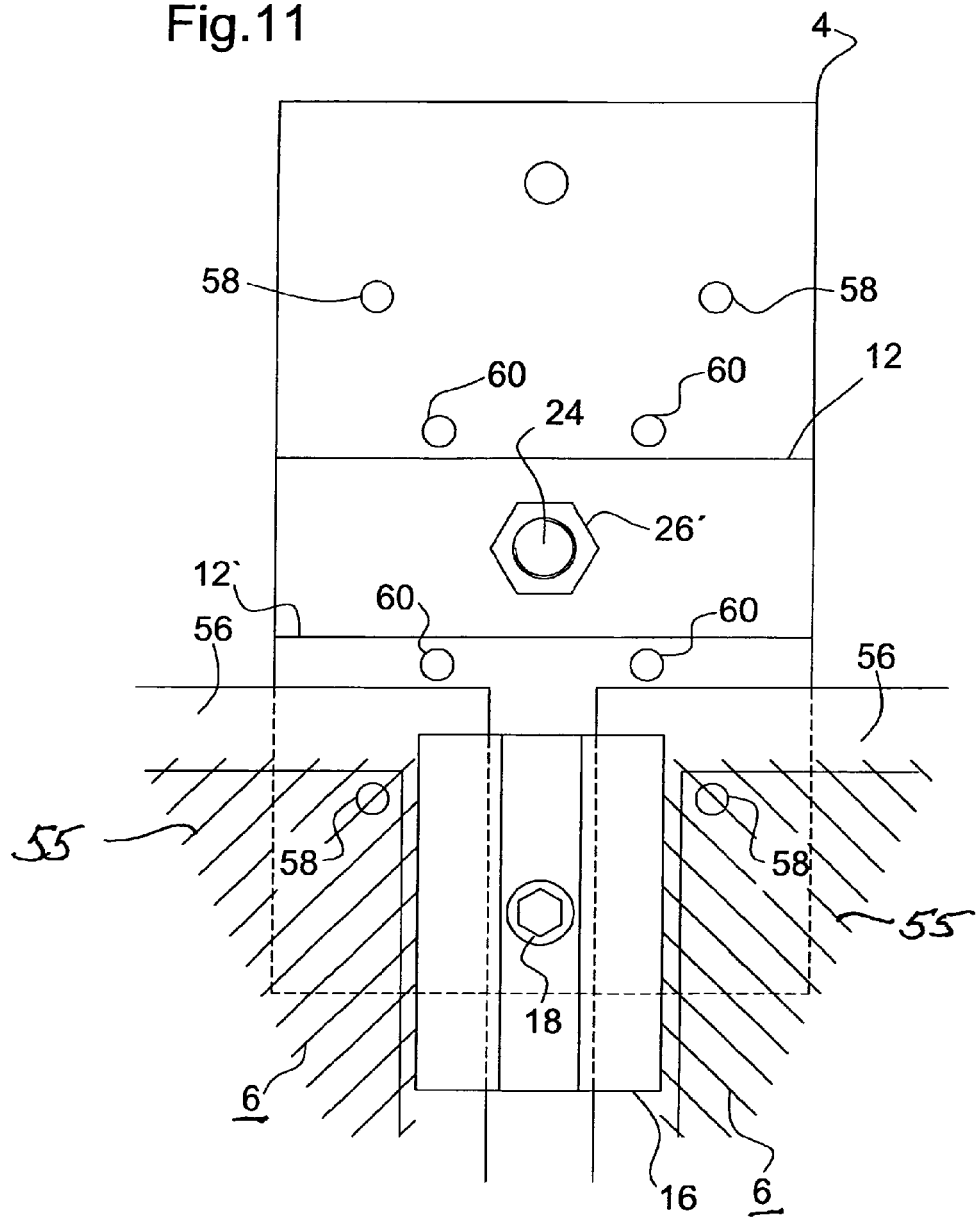

RETAINING SYSTEM FOR INSTALLING A PHOTOVOLTAIC MODULE

CROSS-REFERENCE TO RELATED APPLICATIONS

This application is a 371 U.S. National Stage of International Application No. PCT/EP2012/003473, filed Aug. 16, 2012, which claims priority to German Patent Application No. 10 2011 116 926.5, filed on Oct. 26, 2011 and German Patent Application No. 10 2012 008 001.8, filed on Apr. 20, 2012, the disclosures of which are herein incorporated by reference in their entirety.

The invention relates to a holding system for mounting a photovoltaic module to a base by means of ground supports which comprise a bearing head, a ground support body and a bearing surface on the bottom side, which counteracts a penetration of the ground supports into the base.

When free-field photovoltaic plants are constructed, a supporting structure is normally erected for the multitude of photovoltaic modules (PV modules), the supporting structure consisting of supports of varying length. Crossbeams extending across supports of equal length are arranged on the supports. A multitude of parallel beams is, in turn, arranged transversely to the crossbeams at module dimensions which are adjusted to the length or width of the PV modules. The PV modules which are either framed or not framed, are mounted to the beams by means of clamps.

The relatively short supports comprise a length of approx. 0.8 meters to 1.1 meters, whereas the relatively long supports can have lengths of 1.5 meters to 3 meters or more. Supports of known lengths require safe anchorage in the ground or base, which entails additional costs in terms of ramming work or the placement of foundations. The relatively long and high supports are to advantage in that the PV modules are accessible from below in a relatively convenient manner while they are mounted. This is, in particular, also essential for the future maintenance of the terrain on which the photovoltaic plant is located. For reasons of environmental protection, this terrain usually is a green area which has to be mowed at regular intervals in summer.

While, in the past, the share of the steel and/or wooden structure of the framework in the plant costs was approx. 10%, the share of the substructure in total costs must presently be estimated to be 20% to 30%.

The object of the invention, therefore, is to present a structurally simple and cost-effective substructure for a free-field PV plant, which is particularly suitable for construction at a low height.

This object is solved according to the invention by means of the features of Claim 1. Advantageous embodiments and refinements are the subject matter of the subordinate claims.

To achieve this, it is provided that the ground supports comprise at their heads a bearing plate that is disposed at a slanted angle in relation to the base and that the ground supports are provided and set up such that, in the mounted state, the bearing plates of a ground support pair are spaced apart from each other vertically in relation to the base and from each other horizontally in adjustment to the preferably framed photovoltaic module and that they are aligned with each other at least in essence. This provides a simple and material-saving arrangement even for low mounting heights, said arrangement being characterized by a required number of support pairs each having two separate ground supports.

The invention is based on the consideration that, owing to modern robotics, automatic lawn mowers are available which independently mow lawns while avoiding obstacles and can, therefore, also be used for PV plants comprising a multitude of ground supports between which a green ground can be mowed and, therefore, maintained in a reliable manner.

As regards assembly, the bearing plates are coupled to the ground supports by means of a connection. To implement a connection, it is, for example, conceivable that the ground supports comprise a threaded hole in the vicinity of their bearing head and the bearing surfaces can be screwed into the threaded hole either directly or by means of an articulation-like connection structure. The separation of the support element from the bearing plate or bearing surface is to advantage in that, on the one hand, it facilitates manufacturing the support elements as uniformly and easily as possible and, on the other hand, it allows reaching as high a flexibility as possible while mounting the PV modules by replacing or varying the bearing plates or, rather, their angle of inclination. As a result, the assembly of PV plants can be particularly cost-effective and time-saving, even if the PV plants are extensive.

In a suitable embodiment, the ground support body is formed by a carrier element which comprises a cross-section that is, in particular, U-shaped. In this embodiment, the horizontal U-leg is, for example, designed as a bearing plate. Due to the U-shaped cross-section, this embodiment is, on the one hand, stable and, on the other hand, it saves material. This embodiment version is particularly advantageous for PV plants which are mounted to relatively soft flat roofs or bitumen roofs.

In an alternative embodiment that is likewise suitable, the ground support body is a bar. In this embodiment, the ground supports are, in particular, support posts that can be driven into the base and ensure a particularly high stability in view of the wind loads acting from all directions. For example, the support posts can be produced as an injection molded part made of plastic or as a cast part made of metal. Furthermore, the support posts can, for example, have the structure of a hollow cylinder to further reduce the material costs.

In a preferred refinement, the connection sites between the respective bearing plate and the respective ground support body of a first ground support and the second ground support of the ground support pair are spaced apart according to the following equation:

$$a_{v2} = a_{v1} + a_h \cdot \tan \alpha$$

Here, $\alpha$ is the angle of inclination, $a_{v1}$ is the relatively short vertical distance of the connection site of the first ground support from the base, $a_{v2}$ is the relatively long vertical distance of the connection sites of the second ground support from the base, and $a_h$ is the horizontal spacing between the connection sites of the ground support pair.

The simple geometric relationship ensures that the PV modules can always be mounted at an assembly height that is as low as possible as well as in the proper position and alignment. It is, for example, possible that, at a certain assembly site, the horizontal spacing between the connection sites of the ground support pair (support element pair) must be varied, for example, to mount large-size PV modules and/or a multitude of PV modules, wherein this can be corrected by appropriately adjusting one or both of the vertical distances. This is to advantage in that it increases the flexibility of the holding system.

The angle $\alpha$ serves not only to adjust a favorable inclination and alignment of the PV modules in relation to the sun but is rather supposed to ensure that the modules are self-cleaned by rain and that, if necessary, a snow layer slips off. The different heights at which the bearing plates are disposed after mounting can, for example, be achieved by driving the first ground support down to a depth that is different from that of the second ground support.

In a particularly advantageous embodiment, the bearing plate of a first ground support is provided for the edge of one or a multitude of photovoltaic modules, which comprises an upward chamfer below the angle of inclination on each of the opposite sides. At the upper end of the second ground support of the pair, it is appropriate to provide a bearing plate for the edge of one or a multitude of PV modules, which comprises a downward chamfer below the angle on each of the opposite sides.

Therein, a bearing plate is to be understood as any receiving element that is suitable for the frame of the framed module to rest thereupon. This can, in particular, be a preferably galvanized sheet metal plate or a wire framework, a shaped plastic plate, or a frame made of sectional strips. It is important that the bearing plate comprises two chamfers or parts that are angled or bent in an appropriate manner, on which the module frames can be mounted at a specifiable angle in relation to the base.

According to an alternative embodiment, the ground support body is a bar. If the base surface is a disk in a suitable embodiment, it is appropriate that a mandrel that can be driven into the base is arranged on the bottom side of said disk, particularly in the form of a pointed extension of the bar. A disk is to be understood as a structural means which prevents the bar from penetrating into the base in an unhindered manner. That means that it can be a flat sheet metal plate or a concrete disk or, generally, a component which comprises wing-like webs in the way of a ski pole and prevents an undesired or unintentionally deep penetration into the base. A bar is to be understood as an elongated component, such as, e.g., a solid pole, a square tube or a round pipe which is adapted to connect the disk to the bearing plate in a rigid manner.

A chamfer is to be understood as any type of change in direction of the surface of the bearing plate. Therein, an upward chamfer has a surface that extends upwards at a slanted angle. A downward chamfer results in a surface that extends downwards at a slanted angle. The chamfer itself can be a clear edge or a curved or any other suitable shape which results in the desired change in direction of the bearing plate. Therein, it is also possible to use an additional component, for example, an attached sheet metal strip.

The measures according to the invention are, in particular, to advantage in that heavy components of conventional substructures, such as supports, crossbeams and beams, are no longer applicable and are replaced by a multitude of lightweight and particularly manageable ground supports.

This allows configuring the spacing between the bearing surface and the bearing plate within a range from 30 cm to 100 cm, more preferably from 40 cm to 80 cm, and most preferably from 50 cm to 60 cm. As compared with prior art, the supports for the PV modules are relatively short, thus reducing the material required. Due to the low construction height, wind, if any, cannot cross below the substructure and generate correspondingly high lifting forces below the PV modules as it is the case with PV modules that are positioned at a comparatively high level. The PV modules, therefore, hardly offer any contact surface for wind.

It is, therefore, sufficient to design the bearing surface as a disk, wherein a mandrel that can be driven into the terrain can be arranged on the bottom side of the disk which is, in particular, formed by a pointed extension of the bar. The mandrel prevents the ground support from slipping laterally and simultaneously contributes to counteracting any lifting force caused by wind. However, the lifting force is, in essence, met by the own weight of the mounted PV modules, which prevents the ground support from lifting from the terrain.

In addition or as an alternative to the mandrel, the bottom side of the bearing surface can be provided with an anti-slip structure wherein, in this case, a loading weight should be provided on the disks. It is also possible to provide the loading weight only in connection with the mandrel without an anti-slip structure if the own weight of the PV modules is insufficient to be in excess of the expected lifting forces together with the retaining effect of the mandrel. What can be considered as an anti-slip structure are, for example, a corrugated bottom side of the disks, a bottom side with spikes, or the like.

In order to design the ground support as simply and cost-effectively as possible in its construction, it is advantageous if the bar is round and comprises an external thread at least in the upper partial section, the external thread being aligned with a central hole having an internal thread which is arranged between the respectively opposite chamfers of the bearing plate. In the mounted state, the intermediate part between the chamfers of the bearing plate is, therein, arranged essentially parallel to the terrain, with the result that the bar points in the direction of the normal with respect to the horizontal intermediate part of the bearing plate. The same applies to the lower partial section of the bar, which also comprises an external thread at least there, the external thread being aligned with a central hole having an internal thread which is arranged in the center of the disk. Both partial sections of each ground support serve to compensate any unevenness in the terrain which have potentially remained after the base was leveled. This creates the possibility to achieve a uniform arrangement of the PV modules in one plane (exclusive of intentional angles in relation to the terrain).

The different heights of the two ground supports above the terrain level can be achieved by means of bars of different lengths. As an alternative, it is also possible to have bars of equal length wherein, in this case, the ground support of the pair is driven deeper into the ground than the other ground support of the pair. The bar sections having the external thread can then be used to adjust the levels of the disk and the bearing plate such that the desired difference in height between the two bearing plates of the pair have been achieved.

Any irregular lowering of the ground supports is compensated by the fact that the bearing plates are made of an elastic material, with the result that any torsion generated by the ground supports settling differently into the terrain is counterbalanced inside the bearing plates. The torsion may indeed be there but, should the situation arise, does not result in excessively high mechanical tension in the bearing plates because such tension is prevented due to the elasticity. Suitable as an elastic bearing plate is, in particular, a spring steel sheet, a disk made of plastic, such as Teflon, a metal sheet that is elastic because of its small thickness, or the like.

To attach the framed PV modules, the lateral surface formed by each chamfer is provided with a threaded hole for attaching a module clamp and with a centering pin which faces upwards and engages a congruent recess in the frame of the PV module in the mounted state. In the stead of or in addition to the centering pin, it is also possible to use an auxiliary mounting pin.

In a suitable embodiment, the bearing plates each comprise a holding structure which, in the mounted state, gears with a complementary counter structure on the bottom side of the PV module. In a suitable embodiment, the holding structure and the counter structure are designed approximately like saw teeth, with the result that an anti-slip attachment of the PV modules on the bearing surfaces can be implemented in an easy and safe manner.

In a suitable further development, the bearing plates on the one hand and the bottom side of the PV modules on the other hand are connected by means of an adhesive in a non-detachable manner, or the PV modules can be fixed in position by means of clamps in a form-fit and nondestructive manner. As a result, a clip, velcro, spring-lock or snap-fastener closure, for example, facilitates fast mounting of the PV modules without needing any tools. A glued connection allows a more uniform tension distribution and force transmission to the corner regions and edges of the PV modules and also allows saving both weight and costs. The glued connection can, in particular, be designed in the way of a movement, expansion or dilatation joint in order to reduce the risk of stress cracks of the PV modules due to torsional forces, if any are occurring.

In an appropriate embodiment, the bearing plates comprise a pad in at least one corner region to protect the edges of the PV modules and attach them in an anti-slip manner. This relieves the corners of a mounted PV module if forces act on the surface of the PV module, for example, during assembly or maintenance. Appropriately, the pad is made of a material, preferably of an elastic rubber material, which is softer than the material of the bearing surface and/or the bottom side of the photovoltaic module. In an additional or alternative embodiment, it is, for example, conceivable that the entire surface area of the bearing surfaces is additionally coated or covered with a soft flexible material.

Where small-size PV plants, such as they are, for example, used on bitumen roofs, are concerned, the bearing surfaces can be loaded with cost-effective weights, such as concrete, for reasons of storm resistance, with the result that a force-fit stability is ensured. As a result, it is not necessary to drill through the roof skin, for which reason problems with regard to a tightness that is required and/or to be assured are advantageously avoided. Preferably, the disk comprises a threaded hole or a recessed nut on the bottom side of the disk, wherein the thread of the ground supports can be screwed into said threaded hole or recessed nut. In addition or as an alternative, it is conceivable to arrange a counter nut on the top side of the disk.

In a preferred refinement, the edge of the disk is bent upwards in the way of a bowl. Thereby, a tiltable bearing of the holding system is implemented, which advantageously and easily improves the storm resistance. Herein, the operating position of the PV modules is maintained by a minor overweight by means of the load. If a heavy wind load is occurring, the PV modules can autonomously turn or tilt out of the wind due to the developing lifting forces, whereby a simple and cost-effective storm protection is implemented.

Where extensive PV plants are concerned, the pairs of ground supports can be arranged in various manners for forming a support array to be fitted with PV modules. According to a first preferred type, it is provided that the first ground supports and the second ground supports each form a multitude of rows extending in parallel to each other, wherein a row of second ground supports is disposed between two rows of first ground supports. The ground supports of rows of differing length are each disposed opposite to each other at the same height, i.e. immediately side by side. Thus, the bearing plate of each ground support serves to support two framed edges at any point of the module edge of a PV module. One of the chamfered partial areas serves to receive a first PV module edge and the other partial area serves to receive a frame edge of a neighboring PV module edge. The spacing between ground supports of equal length is then, for example, half the module width, with the result that there is approximately half the module width between two neighboring supports and a quarter of the module width projects beyond the ground support on the left or right of one of the neighboring ground supports each. With this arrangement of the ground supports, it is also conceivable to adjust the spacing between the ground supports to the width of the PV module used. Thereby, each bearing plate can receive four corners of PV modules arranged in a rectangle, i.e., one corner per PV module.

The second preferred type of ground support arrangement provides that the rows with first ground supports are staggered in relation to the rows with second ground supports, with the result that, with the PV modules mounted (except the PV modules on the edge sides), every PV module is attached to a total of three bearing plates. Therein, the shorter ground supports are arranged such that the spacing between ground supports of equal length is, e.g., half a module width. Therefore, there is about half a module width between two neighboring supports, and a quarter of a module width projects beyond the ground support on the left or right of one of the neighboring ground supports each. Here as well, the spacing can be selected such that, at its two corners, the lower edge of each PV module rests on one of the ground supports of shorter length. As a result, the lower frame edge is supported by two bearing plates. This is advantageous in order to absorb the higher load on the lower edge as compared with the load on the edge that is disposed at a higher level.

The staggered arrangement of the longer ground supports in relation to the shorter ground supports must be dimensioned such that each ground support of greater length is disposed approximately in the center of a PV module edge. As a result, the upper module edge is only supported by a single ground support in the center of the module edge. The PV module is, therefore, supported at three points, i.e., at two supporting points at the lower edge and at one supporting point at the upper edge.

Below, exemplary embodiments of the invention will be illustrated in more detail by means of a drawing. In the drawing, FIG. 1 is a perspective view of a first arrangement of photovoltaic modules on a multitude of pairs of ground supports;

FIG. 1*a* is a top view of the arrangement according to FIG. 1;

FIG. 2 is a perspective view of a second arrangement of photovoltaic modules on a multitude of pairs of ground supports;

FIG. 2*a* is a top view of the arrangement according to FIG. 2;

FIG. 11 shows an arrangement of an auxiliary mounting pin on a bearing plate.

Parts and sizes corresponding to each other are provided with equal reference symbols in all of the figures.

Figure 1:
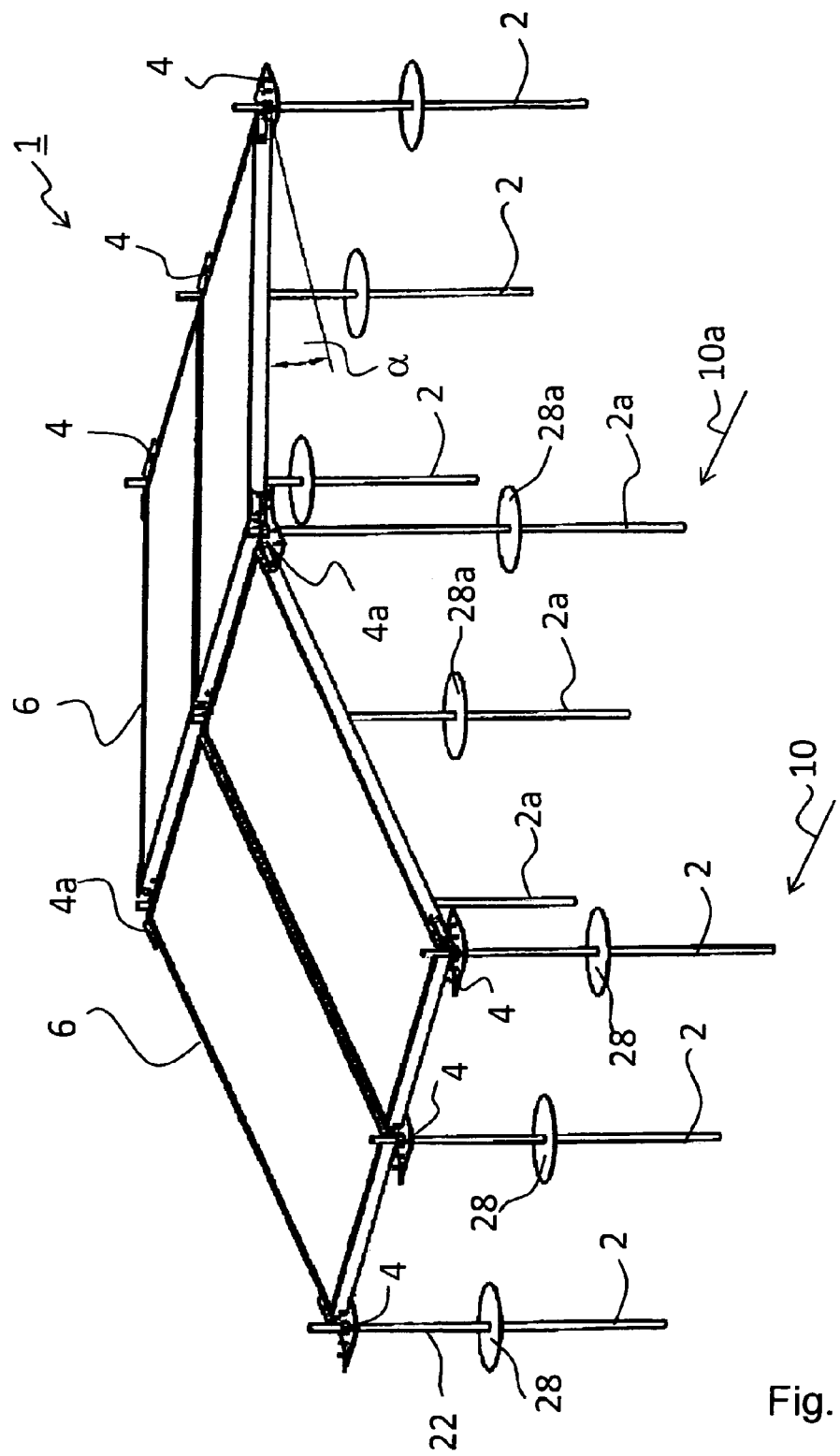
Figure 1A:
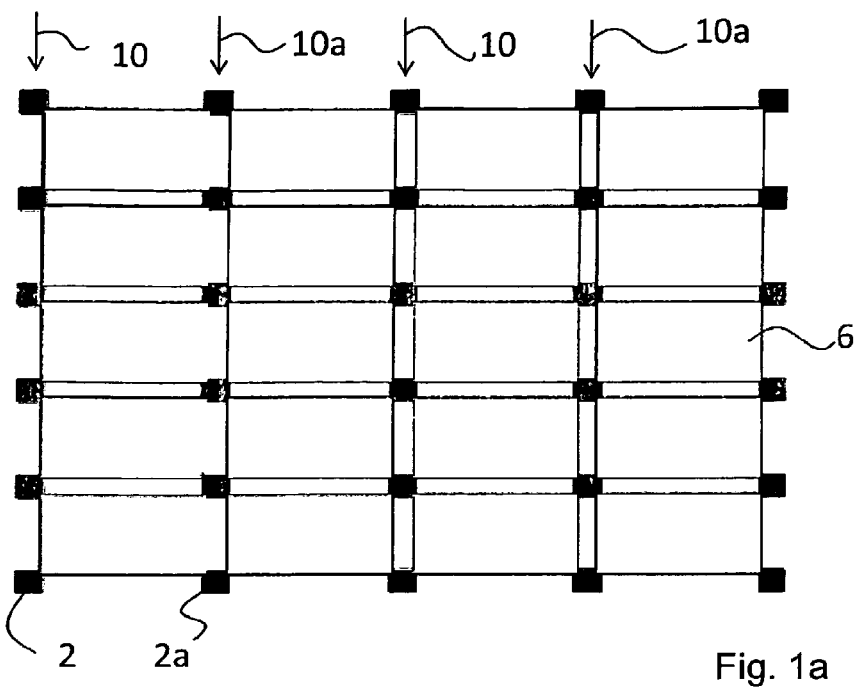

FIG. 1 shows a holding device (holding system) 1 for a photovoltaic plant. In FIGS. 1 and 1a, first and second ground supports 2 and 2a, respectively, are called a pair. Each ground support 2, 2a comprises a bearing plate 4, 4a for photovoltaic modules (PV modules) 6. The PV modules 6 are provided with a frame (not shown) on their edge sides. The ground supports 2, 2a are mounted on a base 8 such that their associated bearing plates 4, 4a are disposed at different levels and the PV modules 6 are aligned in relation to the base 8 at a desired angle α.

In the exemplary embodiment shown, the bearing plate 4 of the first ground support 2 is disposed at a lower level above the base 8, i.e. at a shorter vertical distance from the base 8 than the bearing plate 4a of the second ground support 2a. The angle α does not serve to adjust a favorable inclination of the PV modules 6 in relation to the sun but is supposed to ensure that the modules 6 are self-cleaned by rain and, if necessary, a snow layer slips off. The different heights at which the bearing plates 4, 4a can be disposed after mounting can, for example, be achieved by driving the ground support 2 to a depth that is different from that of the ground support 2a.

In this first embodiment, the respective bearing plate 4, 4a each supports four corners of four photovoltaic modules 6 that are arranged against each other at their corners. In a relatively large array or a correspondingly large PV plant comprising a multitude of hundreds of PV modules 6, this then results in a multitude of rows of first ground supports 2 (denoted by a first arrow 10) which alternate with rows of second ground supports 2a (denoted by a second arrow 10a). The ground supports 2, 2a disposed in the respective row 10, 10a are disposed directly opposite the ground supports 2, 2a of the neighboring row 10, 10a. This non-staggered arrangement of ground supports 2, 2a can be relatively clearly seen from FIG. 1a. In FIG. 1a, only one photovoltaic module 6 and one ground support pair 2, 2a are provided with reference symbols by way of example.

Figure 2:
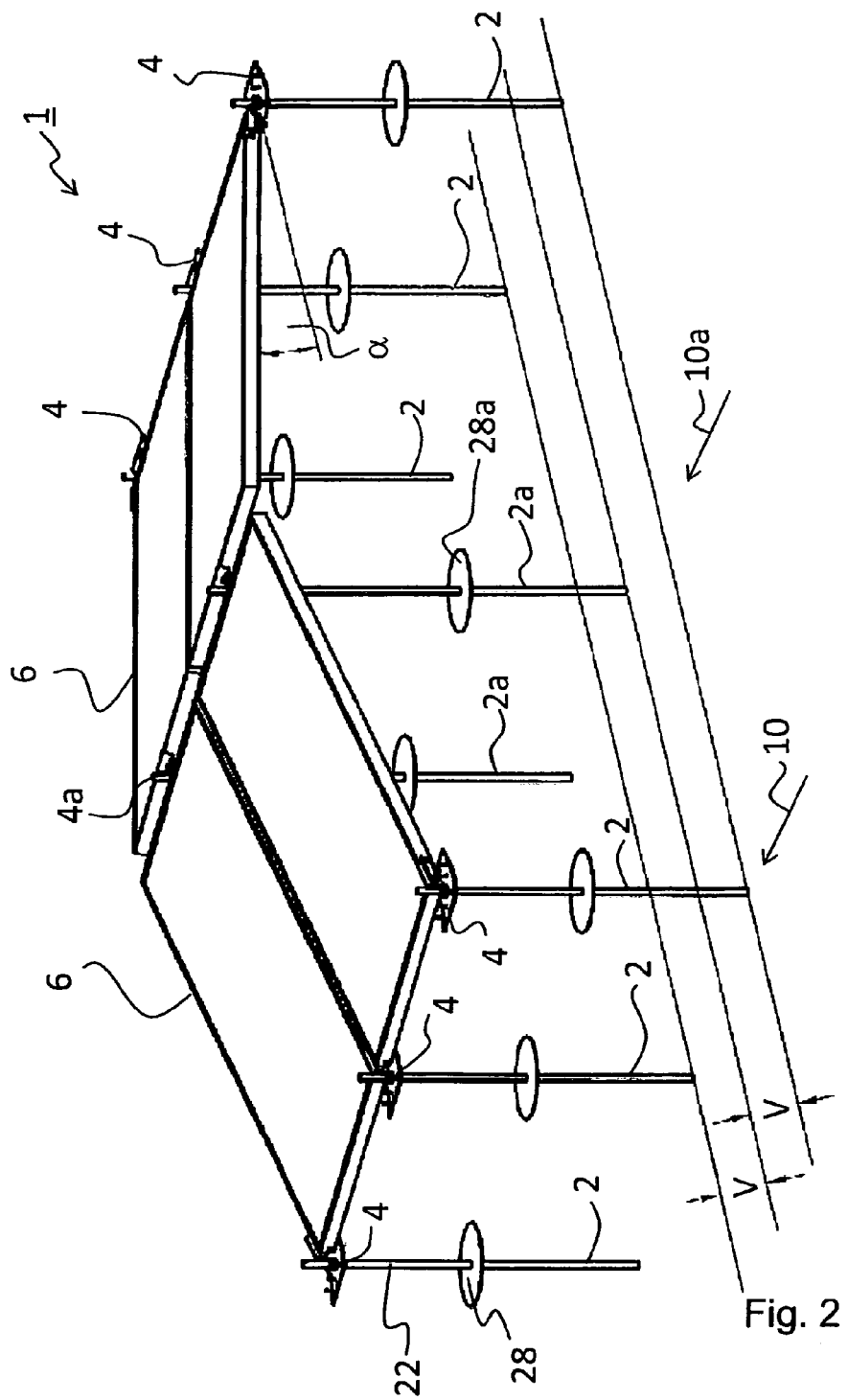
Figure 2A:
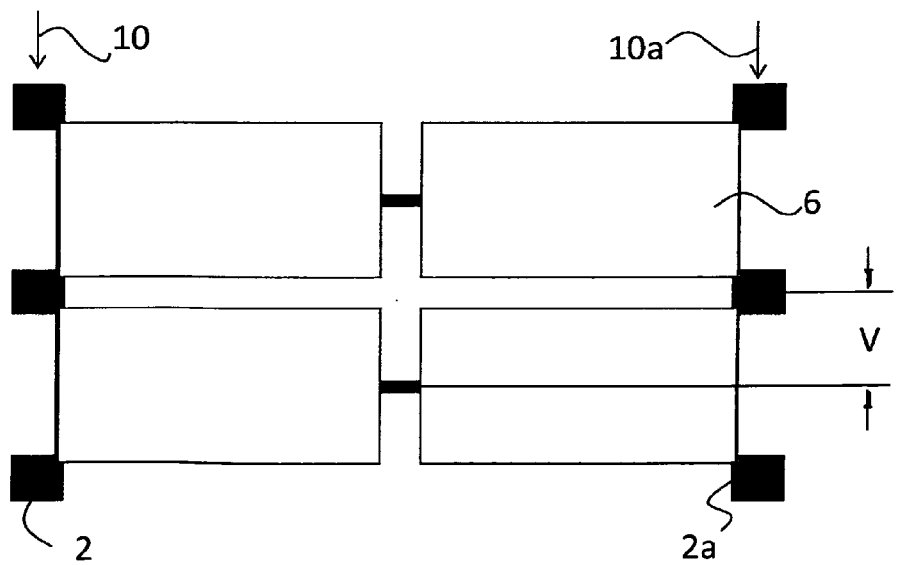

FIGS. 2 and 2a show a similar arrangement with the difference that the bearing plates 4a of the second ground supports 2a are not applied to the corners of the supported photovoltaic modules 6 but to the center of the framed edge. Therefore, the second ground supports 2a are those with the bearing plate 4a at a higher level. The first ground supports 2 the bearing plates 4 of which are arranged on the lower level are positioned at the corners of the photovoltaic modules 6 in analogy with FIG. 1. This, therefore, results in a three-point support for each photovoltaic module 6, which is accompanied by a mechanical load on the corners of the glass disks of the photovoltaic modules 6 if, e.g., a snow load is unevenly distributed, wherein said mechanical load is free from tension to a large extent.

This, in turn, results in two types of rows 10, 10a of first and second ground supports 2, 2a, respectively, with chamfers in different directions (as illustrated in more detail below by means of FIGS. 3 and 4), which extend in parallel to each other. Contrary to the arrangement according to FIG. 1, the ground supports 2 at the same point in a row 10 are not disposed opposite the ground supports 2a of the neighboring row 10a. This means that there is an offset V which essentially corresponds to half the width of a photovoltaic module 6.

Figure 3:
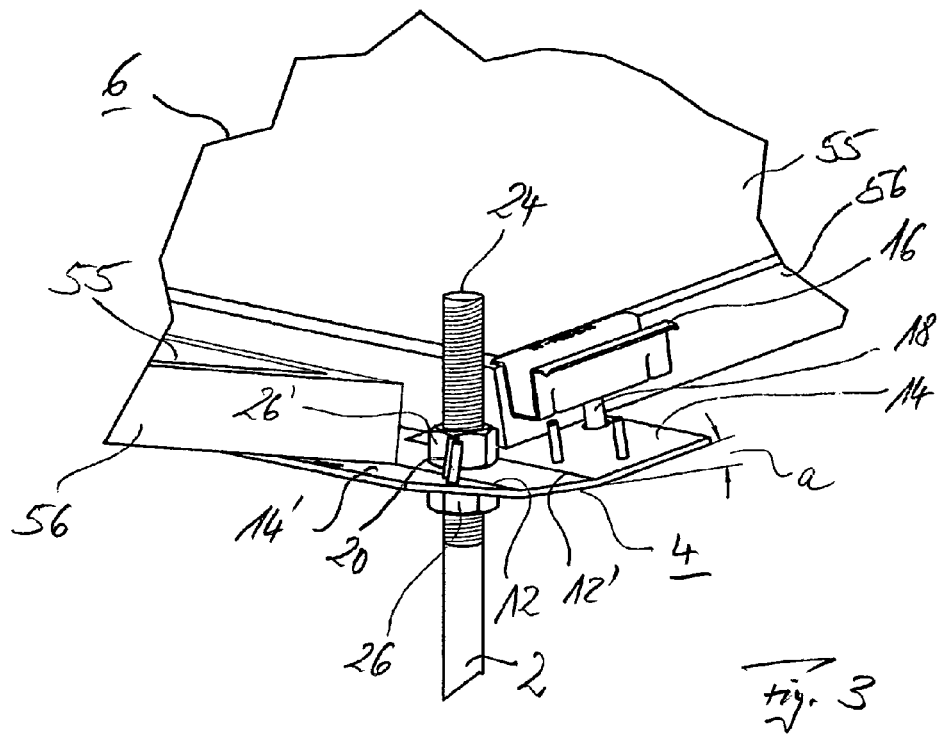
FIG. 3 shows the upper region of a first ground support of a pair.

FIG. 3 shows the upper region of the first ground support 2 with its bearing plate 4. The bearing plate 4 comprises two chamfers 12, 12' which form two supporting surfaces 14, 14' in the bearing plate 4. The chamfers 12, 12' are directed upwards, i.e. the bearing surfaces 14, 14' also face upwards, preferably at the angle α in relation to the horizontal, which defines the desired inclination of the photovoltaic modules 6 in relation to the base 8.

The bearing plate 4 of the ground support 2 shown is designed for supporting one corner each of four adjacent photovoltaic modules 6, the two rear ones of which are plotted here. For their attachment, there are two module clamps 16 which each assume the task of clamping two photovoltaic modules 6. Each module clamp 16 comprises a hole (not visible) in its ground or bottom, through which a screw 18 or a threaded pin can be securely connected to the bearing surface 14 in order to fix the module clamp 16 in position on the bearing surface 14, 14'. To achieve this attachment, the bearing plate 4 is preferably provided with two riveting nuts one of which is each approximately arranged in the center of the respective bearing surface 14, 14'. It is also possible to provide a hole with an internal thread in the stead of the riveting nuts, wherein the screw 18 can be screwed and braced into said hole.

To fix each photovoltaic module 6 in position on the ground support 2, two centering pins 20 are provided. Four of the total of eight centering pins 20 are not visible in FIG. 3 because they are hidden by the photovoltaic modules 6 which are shown in their already mounted state. The four visible centering pins 20 are provided for the two front photovoltaic modules 6 which must still be mounted.

The first ground supports 2 each comprise a bar 22 which can be a threaded bar or can be provided with an external thread 24 at least in its upper region. Two nuts 26, 26' are provided on the external thread 24, wherein the first nut 26 is arranged below the bearing plate 4 and secures the latter such that it cannot slip down. Along with the lower nut 26, the upper nut 26' braces the bearing plate 4 securely to the bar 22.

Figure 4:
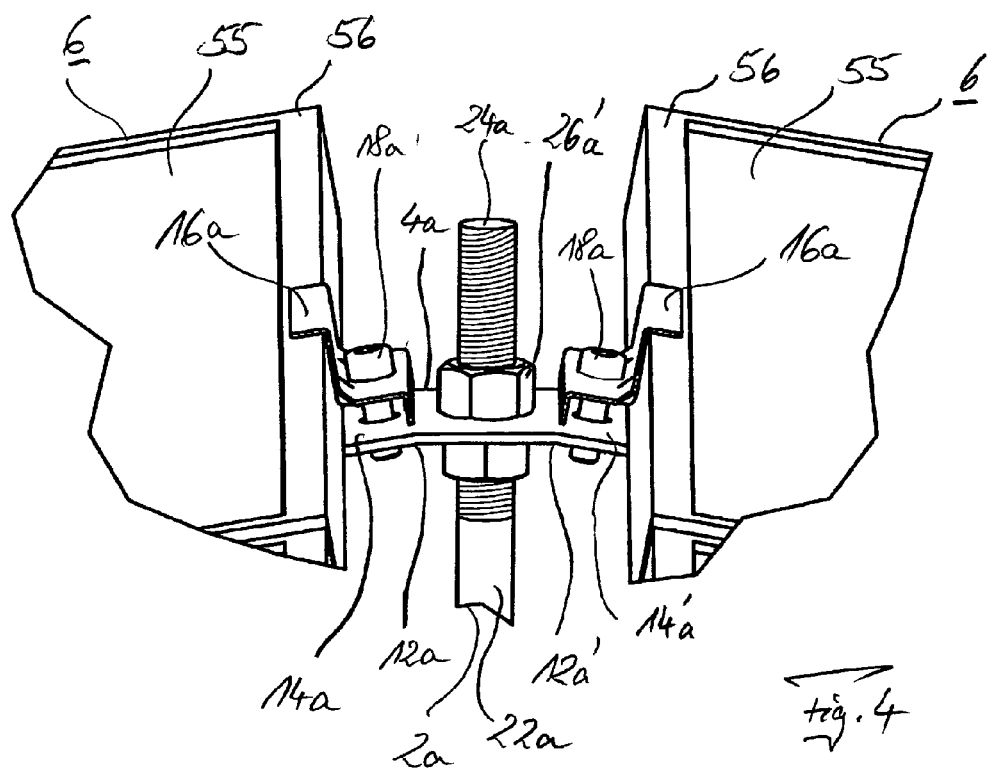
FIG. 4 shows the upper region of a second ground support of a pair.

FIG. 4 shows a type of the second ground support 2a which is to be provided for arrangement in the center of the framed edge of the photovoltaic module 6. Equal parts are provided with an additional "a" to indicate that this is the second ground support 2a. The second ground support 2a is the one the bearing plate 4a of which is disposed at a higher level than the bearing plate 4 of the first round supports 2. In contrast to the ground support 2 shown in FIG. 3, the chamfers 12a, 12a' of the second ground support 2a are, accordingly, directed downwards at the angle α. The bearing surfaces 14a and 14a' formed by the chamfers 12a, 12a', therefore, face down towards the complementary bearing surfaces 14, 14' of the first ground support 2, with the result that all bearing surfaces 14, 14a which hold the same photovoltaic module 6 are disposed in a common plane.

A corresponding centering pin 20 is likewise provided in the bearing plates 4a of the second ground support 2a in order to hold the photovoltaic module 6 in an aligned position. For reasons of mass production, the module clamps 16 are the same ones as those for the four-corner attachment according to FIG. 3. To save costs, it can, where necessary, be appropriate to omit the unused web which otherwise serves to brace a further module 6, because said web is not required in case of the central position of the clamp 16 at the edge of the module that is shown here.

As a result, the bearing plate 4 associated with the first ground support 2 of the pair is provided with two mutually opposite bearing surfaces 14, 14' that are chamfered upwards, and the bearing plate 4a of the second ground support 2a of the pair is provided with two mutually opposite bearing surfaces 14a, 14a' that are chamfered downwards.

Figure 5:
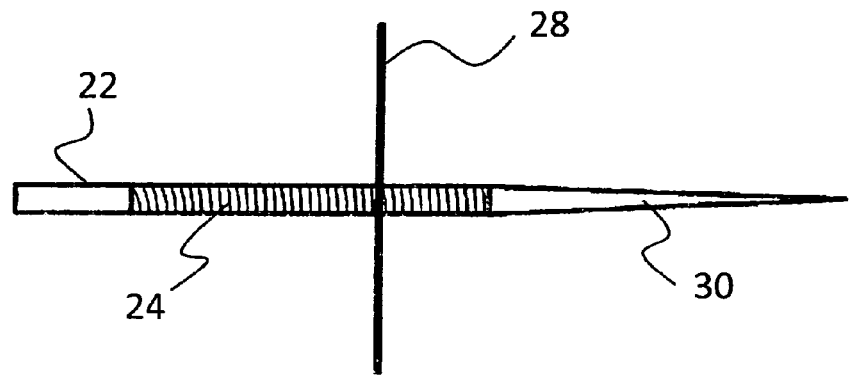
FIG. 5 is a sectional view of the lower region of a ground support in a first embodiment.

FIG. 5 shows a first embodiment of the type of attachment of the ground supports 2, 2a in the base. The figure only shows the lower region of the ground support 2, 2a with the lower part of the bar 22, 22a, this being indicated by an intersecting line. Here as well, a partial section is provided with an external thread 24, unless the bar 22 as a whole is a threaded bar. A disk 28 is screwed onto the external thread 24, said disk 28 comprising for this purpose a central hole with an internal thread that is complementary to the external thread 24 of the bar region. The free length of the bar 22 disposed above the disk 28 is defined by the vertical position of the disk 28. This automatically determines the level of the upper external thread 24 to which the bearing plates 4, 4a are attached. If the level is supposed to be lower, the bar 22 must only be driven down deeper into the base 8. The end of the bar 22 is formed by a point or a mandrel 30 which makes driving it down easier.

Figure 6:
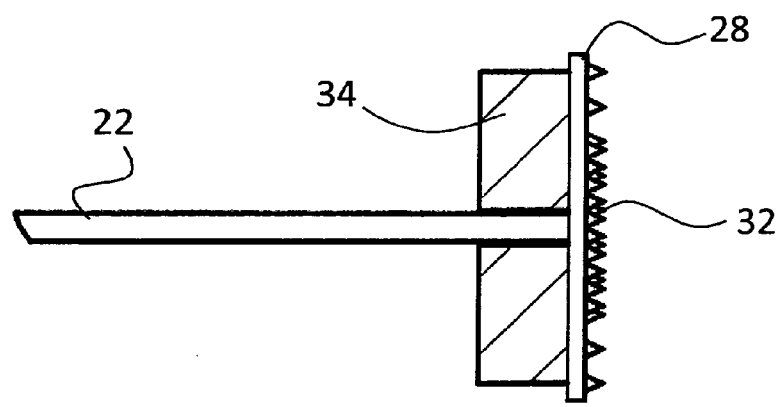
FIG. 6 is a view according to FIG. 5, showing a second embodiment of the lower region of a ground support.

FIG. 6 shows a variant in which, in the stead of (or in addition to) the mandrel 30, the bottom side of the disk 28 is provided with an anti-slip structure, such as, for example, by means of a multitude of spikes 32. In order to reach a contact pressure that is higher than that reached by the own weight of the ground support 2, 2a with the load of the photovoltaic module 6, it may be appropriate to place an additional loading weight 34 on the top side of the disk 28.

Figure 7:
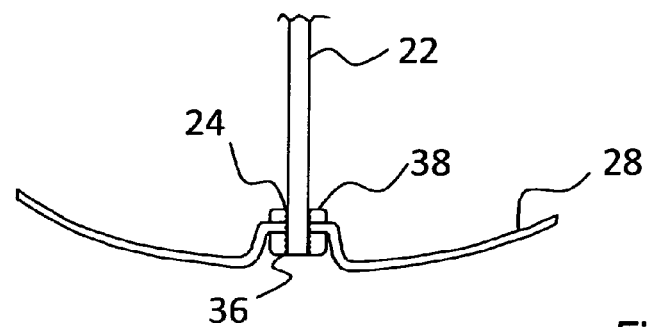
FIG. 7 is a view according to FIG. 5, showing a third embodiment of the lower region of a ground support.

FIG. 7 shows a further alternative embodiment. In this embodiment, the disk 28 is bent upwards at its edges in the way of a bowl, whereby a tiltable bearing of the holding system 1 is implemented. The external thread 24 of the bar 22 engages a central hole of the disk 28 and is screwed to a holding nut 36 at its end on the bottom side, i.e. on the bottom side of the disk. To achieve an operationally safe hold, a counter nut 38 is screwed to the external thread 24 on the top side of the disk, with the result that the disk 28 is retained to the bar 22 by means of the holding nut 36 and the counter nut 38 in a force-fit manner.

Figure 8:
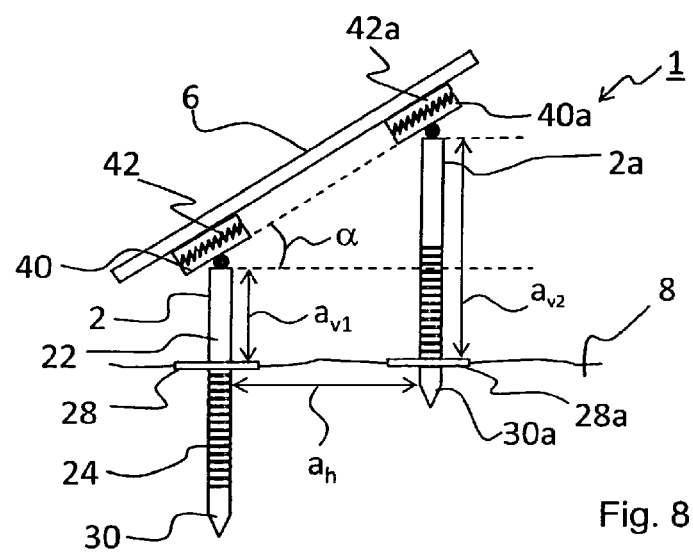
FIG. 8 is a sectional view of an isolated mounted photovoltaic module on a base.

FIG. 8 illustrates the geometrical relationship between the angle of inclination α, the relatively short vertical distance $a_{v1}$ of the connection site of the first ground support 2 from the base 8, the relatively long vertical distance $a_{v2}$ of the connection site of the second ground support 2a from the base 8, and the horizontal spacing $a_h$ between the connection sites of the ground support pair. On the one hand, the ground supports 2, 2a of the rows 10, 10a are dimensioned in their horizontal spacing $a_h$ and, on the other hand, in their vertical levels $a_{v1}$ and $a_{v2}$ such that the following equation applies: $a_{v2}=a_{v1}+a_h\cdot\tan\alpha$.

In the embodiment shown in FIG. 8, the bearing plates 4, 4a are provided with a saw-teeth-like holding contour 40, 40a which, in the mounted state, engages a complementary counter contour 42, 42a on the bottom side of a mounted photovoltaic module 6 and thereby implement an anti-slip hold.

Figure 9:
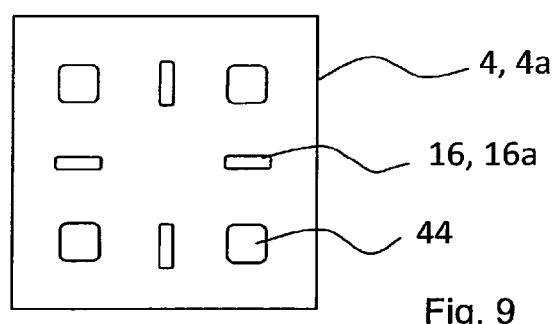
FIG. 9 is a top view of a bearing plate with pads.

FIG. 9 is a top view of the bearing plates 4, 4a in an embodiment with four pads 44 which are each arranged in a corner region of the essentially square bearing plate 4, 4a. The pads 44 are designed as a soft and elastic plastic cushion. This relieves the corners of a mounted photovoltaic module 6 if forces act on the surface of the photovoltaic module, for example, during assembly or maintenance.

Figure 10A:
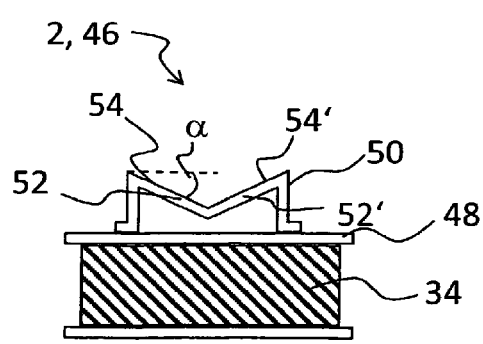
FIG. 10a is a sectional view of a first ground support according to FIG. 10.
Figure 10B:
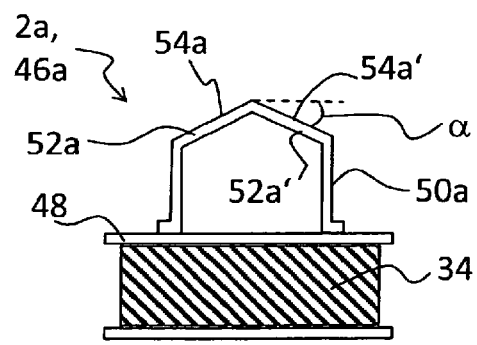
FIG. 10b is a sectional view of a second ground support according to FIG. 10.
Figure 10:
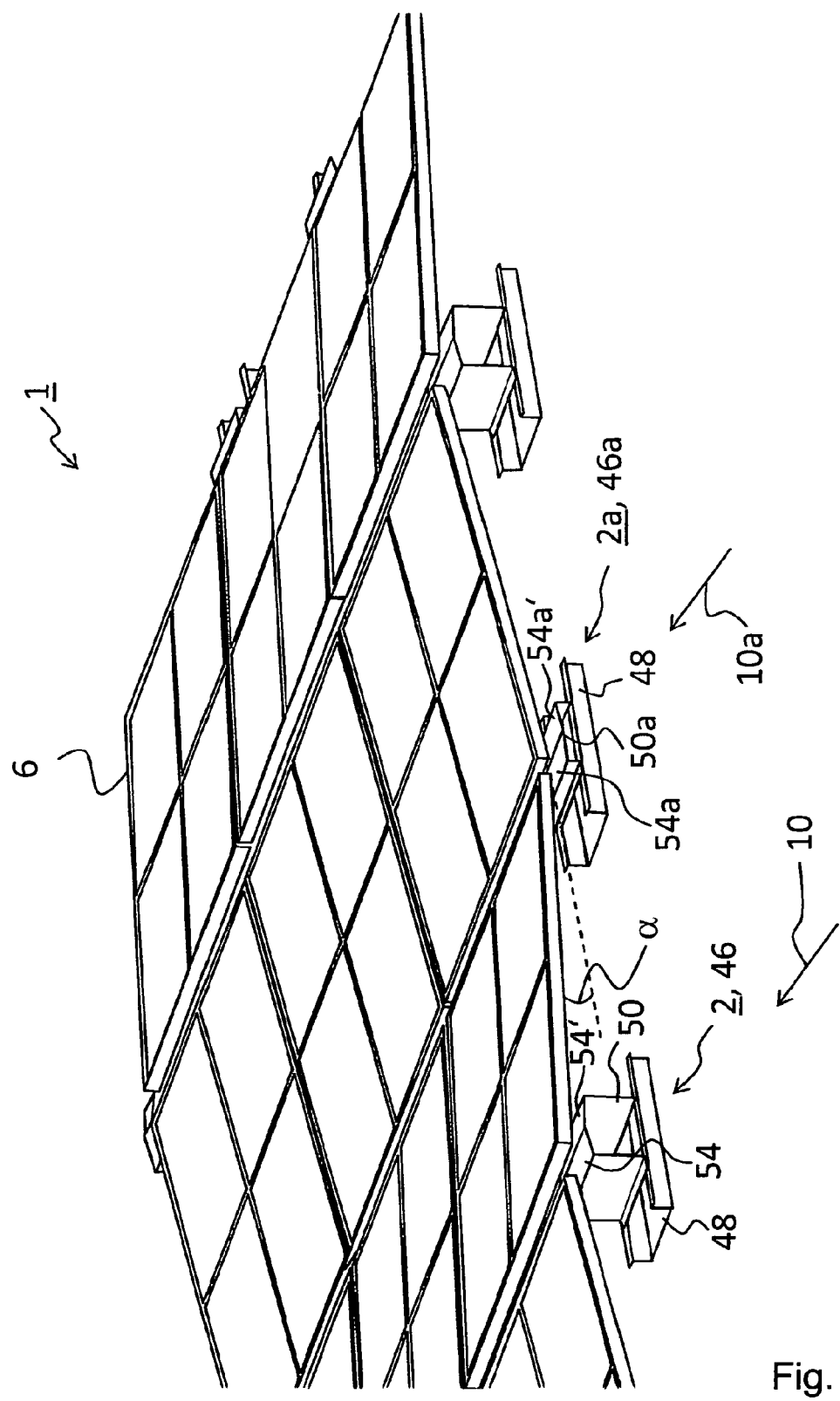
FIG. 10 is a perspective view of an arrangement of photovoltaic modules according to FIG. 1 on a multitude of carrier systems.

FIGS. 10, 10a and 10b show a third example arrangement wherein the ground supports 2, 2a are not designed in the form of bars 22 but with metal carrier systems 46, 46a. The carrier systems 46, 46a are formed from a loading trough 48 that rests on the base 8 and is essentially U-shaped and a bearing beam 50, 50a turned by 90° in relation thereto.

The loading trough 48 rests on the base 8 with its horizontal U-leg and—as can be seen from FIGS. 10a and 10b—is adapted and set up to receive a loading weight 34. The vertical U-legs of the elongated loading trough 48 are aligned vertically in relation to the rows 10, 10a.

In essence, the bearing beams 50, 50a are also U-shaped, wherein the horizontal U-legs are designed in the way of the bearing plates 4, 4a. The vertical U-legs of the bearing beams 50, 50a are aligned vertically in relation to the loading troughs 48, i.e. essentially in parallel with the rows 10, 10a. The vertical U-legs of the bearing beams 50, 50a rest on those of the loading troughs 48 and are connected to each other by means of a welded seam.

The horizontal U-leg of the bearing beam 48 disposed at a lower level comprises two chamfers 52, 52' which form two bearing surfaces 54, 54' of the bearing beam 50. The chamfers 52, 52' are directed upwards, i.e. the bearing surfaces 54, 54' also face upwards, preferably at the angle α in relation to the horizontal, which defines the desired inclination of the photovoltaic modules 6 in relation to the base 8. In contrast to the ground support 2 shown in FIG. 10a, the chamfers 52a, 52a' of the second ground support 50a are, accordingly, directed downwards at the angle α. The bearing surfaces 54a and 54a' formed by the chamfers 52a, 52a', therefore, face down towards the complementary bearing surfaces 54, 54' of the bearing beam 50 of the first ground support 2, with the result that all bearing surfaces 54, 54a which hold the same photovoltaic module 6 are disposed in a common plane.

FIG. 11 is a top view of the bearing plate 4 according to FIG. 3 and of the corner regions of two photovoltaic modules (PV modules) 6 that are shown in parts with their hatched glass surfaces 55. In the edge region of the PV module 6, the respective glass surface 55 is partially covered by a module frame 56 of the respective PV module 6. Mounting pins 58 which, starting from the chamfers 12, 12' of the bearing plate 4, extend upwards in vertical direction are provided in the vicinity of the bearing surfaces 14, 14' of the bearing plate 4. Preferably, two auxiliary mounting pins 58 are provided for each chamfer 12, 12' or, rather, for each bearing surface 14 and 14', respectively. It is also possible to provide further auxiliary mounting pins 60 which are then, preferably, also positioned in the corner region of the PV module 6, however, outside the module frame 56 on the respective bearing surface 14, 14'.

The auxiliary mounting pins 58 comprise a vertical length of approx. 3 mm to 8 mm projecting beyond the chamfer 12, 12'. They are, preferably, provided with a sharp upper edge which allows catching with the lower edge of the module frame 56 in a reliable manner, in order to ensure that the latter cannot slide across the auxiliary mounting pin 58. The auxiliary mounting pins 58 are arranged such that they can abut against the inner edge of the module frame 56. In the shown case of corner mounting of the PV modules 6, the auxiliary mounting pins 58 are disposed inside the module frame 56 in the corner region of the respective glass surface 55.

When a photovoltaic array is mounted, the PV modules 6 are initially deposited on the bearing plates 4, 4a either individually or in groups, from which they cannot slip off due to the auxiliary mounting pins 58, 60 and on which they can slip only a little, if at all. Subsequently, the individual PV modules 6 are aligned and fixed in position by means of the module clamps 16.

The invention is not restricted to the exemplary embodiments described above. In fact, persons skilled in the art can also derive other variants of the invention based thereon, without leaving the subject matter of the invention. Furthermore, all individual features described in connection with the various exemplary embodiments can, in particular, also be combined in another manner without leaving the subject matter of the invention.

The invention claimed is:

1. A holding system for mounting photovoltaic modules above a base by means of ground supports which each comprise a bearing head, a ground support body and a base surface on the bottom side which counteracts a penetration of the ground supports into the base,
wherein the base surface and the bearing head of each ground support are interlinked via the ground support body,
wherein the bearing heads each have an upper surface that faces the photovoltaic modules,
wherein the upper surface of each bearing head has two bearing surfaces that are each disposed at a slanted angle (α) in relation to the base, a first one of the bearing surfaces supports one of the photovoltaic modules and a second one of the bearing surfaces supports another one of the photovoltaic modules,
wherein the ground supports are provided and set up such that, in the mounted state, the bearing surfaces of a ground support pair are spaced apart from each other vertically in relation to the base and from each other horizontally in adjustment to the photovoltaic module and that they are aligned with each other at least in essence,
wherein the bearing surfaces at the upper surface of the bearing head of a first ground support of the ground support pair each have an upward chamfer with the angle (α), such that the bearing surfaces of the bearing head of the first ground support form upwardly directed bearing surfaces that are each angled in opposite directions away from the base, such that one of the photovoltaic modules supported on the first one of the bearing surfaces of the bearing head of the first ground support is angled away from the base in an opposite direction from another one of the photovoltaic modules that is supported on the second one of the bearing surfaces of the bearing head of the first ground support, and
wherein the bearing surfaces at the upper surface of the bearing head of a second ground support of the ground support pair each have a downward chamfer with the angle (α), such that the bearing surfaces of the bearing head of the second ground support form downwardly directed bearing surfaces that are each angled in opposite directions towards the base, such that one of the photovoltaic modules supported on the first one of the bearing surfaces of the bearing head of the second ground support is angled towards the base in an opposite direction from another one of the photovoltaic modules that is supported on the second one of the bearing surfaces of the bearing head of the second ground support.

2. The holding system according to claim 1, wherein the ground support body is bar- or U-shaped and/or the base surface is disk-shaped having a mandrel that can be driven into the base on the bottom side.

3. The holding system according to claim 2, wherein the edge of the disk-shaped base surface is bent upwards in a vertical direction, such that the disk-shaped base surface has a bowl shape.

4. The holding system according to claim 2, wherein the bar-shaped ground support body comprises an external thread at least in a head-sided partial area, said external thread being aligned with and extending through a central hole in the bearing head, the central hole having an internal thread and being arranged between respectively opposite chamfers of the bearing head.

5. The holding system according to claim 2, wherein the bar-shaped ground support body comprises an external thread at least in a lower partial area, said external thread being aligned with and extending through a central hole in the disk-shaped base surface, the central hole having an internal thread.

6. The holding system according to claim 1, wherein, in the mounted state, the connection sites between the respective bearing surfaces and the respective ground support body of the first ground support and the second ground support of the ground support pair are spaced apart according to the following equation:

$$a_{v2}=a_{v1}+a_h \cdot \tan \alpha,$$

wherein α is the angle of inclination, $a_{v1}$ is the relatively short vertical distance of the connection site of the first ground support from the base, $a_{v2}$ is the relatively long vertical distance of the connection sites of the second ground support from the base, and $a_h$ is the horizontal spacing between the connection sites of the ground support pair.

7. The holding system according to claim 1, wherein the bearing surfaces are made of an elastic material and are provided and set up to absorb inside the respective bearing head any torsion generated by the ground supports penetrating differently into the base.

8. The holding system according to claim 1, wherein the bottom side of the base surface is provided with an anti-slip structure and/or that a loading weight is provided on the base surfaces.

9. The holding system according to claim 1, wherein each bearing surface of the bearing heads is provided with a threaded hole for receiving a module clamp and with a centering pin which faces upwards and is provided and set up to engage a congruent recess in a frame of the photovoltaic module in the mounted state.

10. The holding system according to claim 1, wherein the distance ($a_{v1}$, $a_{v2}$) between the base surface and the bearing head is within a range from 30 cm to 100 cm.

11. The holding system according to claim 1, wherein the bearing surfaces of each bearing head comprise a holding structure which is provided and set up to gear with a complementary counter structure on the bottom side of the photovoltaic module in the mounted state.

12. The holding system according to claim 1, wherein the bearing surfaces of each bearing head are provided and set up to hold the photovoltaic modules by gluing or clamping.

13. The holding system according to claim 1, wherein the bearing surfaces of each bearing head comprise a pad in at least one corner region wherein the size of the bearing surfaces are dimensioned such that, in the mounted state, the pad is disposed completely underneath a mounted photovoltaic module.

14. A photovoltaic plant comprising a multitude of photovoltaic modules and comprising a holding system according to claim 1,
wherein first ground supports and second ground supports of multiple ground support pairs each form a multitude of rows that extend in parallel to each other, and
wherein a row of second ground supports is arranged between two rows of first ground supports.

15. The photovoltaic plant according to claim 14, wherein the rows of the first ground supports are staggered in relation to the rows of the second ground supports such that, when the photovoltaic modules except photovoltaic modules on the edge sides are mounted, each photovoltaic module is attached to a total of three bearing heads.

16. The holding system according to claim 1, wherein the distance ($a_{v1}$, $a_{v2}$) between the base surface and the bearing head is within a range between 40 cm and 80 cm.

17. The holding system according to claim 1, wherein the distance ($a_{v1}$, $a_{v2}$) between the base surface and the bearing head is between 50 cm and 60 cm.

18. The holding system according to claim 1, wherein the bearing heads are directly connected to the ground supports, respectively.

19. The holding system according to claim 1, wherein the bearing head of the first ground support is v-shaped due to the upwardly directed bearing surfaces, and wherein the bearing head of the second ground support is upside-down v-shaped due to the downwardly directed bearing surfaces.

\* \* \* \* \*